(12) United States Patent
Kanazawa et al.

(10) Patent No.: US 6,552,912 B1
(45) Date of Patent: Apr. 22, 2003

(54) INVERTER APPARATUS FOR DRIVING A COMPRESSOR MOTOR AND A METHOD FOR MANUFACTURING THE APPARATUS

(75) Inventors: Hidetoshi Kanazawa, Fuji (JP); Yukinobu Takahashi, Yokohama (JP); Hidetoshi Fukunaga, Shimizu (JP)

(73) Assignee: Toshiba Carrier Corporation, Tokyo (JP)

( * ) Notice: Subject to any disclaimer, the term of this patent is extended or adjusted under 35 U.S.C. 154(b) by 0 days.

(21) Appl. No.: 10/048,025

(22) PCT Filed: Jul. 27, 2000

(86) PCT No.: PCT/JP00/05032

§ 371 (c)(1),
(2), (4) Date: Jan. 28, 2002

(87) PCT Pub. No.: WO01/10006

PCT Pub. Date: Feb. 8, 2001

(30) Foreign Application Priority Data

Aug. 2, 1999 (JP) .............................................. 11-219137

(51) Int. Cl.⁷ ............................ H05K 5/00; H05K 1/18; H02M 1/00
(52) U.S. Cl. ......................... 361/752; 361/763; 363/144
(58) Field of Search ................................. 361/601, 622, 361/623, 627, 631, 643, 644, 748, 752, 760, 761, 763, 807; 363/34, 37, 55, 56.01, 144, 146, 147; 318/439, 798, 800, 801, 803, 805, 806

(56) References Cited

U.S. PATENT DOCUMENTS

| 2,525,436 | A | | 10/1950 | Williams, Jr. | |
|---|---|---|---|---|---|
| 4,617,611 | A | | 10/1986 | Miura et al. | |
| 4,745,521 | A | | 5/1988 | De Lima Filho | |
| 5,179,842 | A | * | 1/1993 | Kanazawa | 62/158 |
| 5,610,493 | A | | 3/1997 | Wieloch | |
| 5,675,223 | A | | 10/1997 | Yoshizawa et al. | |
| 6,181,590 | B1 | * | 1/2001 | Yamane et al. | 363/132 |

FOREIGN PATENT DOCUMENTS

EP          0 688 092 A2    12/1995

* cited by examiner

Primary Examiner—Matthew Nguyen
(74) Attorney, Agent, or Firm—Pillsbury Winthrop LLP

(57) ABSTRACT

A rectifier circuit (3) and a switching circuit (6) are mounted on a board (30). The board (30) is contained in a case (10) along with one or more capacitors (4, 5). In particular, the capacitors (4, 5) are laid sideways in the case (10).

8 Claims, 7 Drawing Sheets

INVERTER APPARATUS FOR DRIVING A COMPRESSOR MOTOR AND A METHOD FOR MANUFACTURING THE APPARATUS

This application is the National Phase of International Application PCT/JP00/05032 filed Jul. 27, 2000 which designated the U.S. and that International Application was published under PCT Article 21(2) in English.

TECHNICAL FIELD

The present invention relates to an inverter apparatus for driving a compressor motor, which is a component of a refrigerator, an air conditioner, or the like.

BACKGROUND ART

An inverter apparatus is used to drive a compressor motor mounted in a refrigerator, an air conditioner, or the like.

The inverter apparatus comprises a board, a rectifier circuit mounted on the board, one or a plurality of smoothing capacitors mounted on the board, and a switching circuit mounted on the board.

The rectifier circuit rectifies the voltage of an AC power source. The smoothing capacitor smoothes a DC voltage output from the rectifier circuit. The switching circuit converts the DC voltage smoothed by the smoothing capacitor to an AC voltage.

The board is contained in a case, and fixed thereto by screws. The case is contained in an electric component box.

Recently, the components constituting the rectifier circuit and the switching circuit described above have been compact, and the heights of the components on the board have been considerably reduced.

A cylindrical electrolytic capacitor is used as the smoothing capacitor. Since the electrolytic capacitor has a height greater than those of the other components, it projects higher than the other components, when it is mounted on the board. For this reason, the height of the electric component box is determined in accordance with the height of the electrolytic capacitor. Therefore, although the components of the rectifier circuit and the switching circuit become compact, it is difficult to downsize the apparatus as a whole, because of the existence of the electrolytic capacitor.

A structure wherein the electrolytic capacitor is laid sideways is disclosed in U.S. Pat. Nos. 5,675,223, 5,610,493, EP 0688092, U.S. Pat. Nos. 2,525,436, 4,745,521, and 4,617,611. However, the structure wherein the electrolytic capacitor is simply laid is not very effective in reducing the height dimension of the entire apparatus.

DISCLOSURE OF INVENTION

An object of the present invention is to provide an inverter apparatus with a low height, so that the apparatus as a whole can be downsized.

An inverter apparatus of the present invention comprises:
a rectifier circuit for rectifying an AC voltage;
at least one cylindrical capacitor for smoothing a voltage output from the rectifier circuit, the capacitor having at a first end a gas-draining portion which is opened when an internal gas pressure is increased;
a switching circuit for converting the voltage smoothed by the capacitor to an AC voltage; and
a board on which the rectifier circuit and the switching circuit are mounted, the board having a notch at a corner;
a case having a first region for containing the board and a second region for containing the capacitor laid sideways through the use of the notch of the board, and ensuring a space necessary for the gas-draining portion of the capacitor contained in the second region to open, at a position corresponding to the gas-draining portion;
a lead wire drawn from the other end of the capacitor and guided to the first region in a state where the capacitor is contained in the second region of the case, the lead wire being bent at substantially right angles in the first region and connected to the board; and
resin used in the first region of the case and on the board contained in the first region.

BEST MODE FOR CARRYING OUT THE INVENTION

[1] A first Embodiment will be described.

Figure 1:
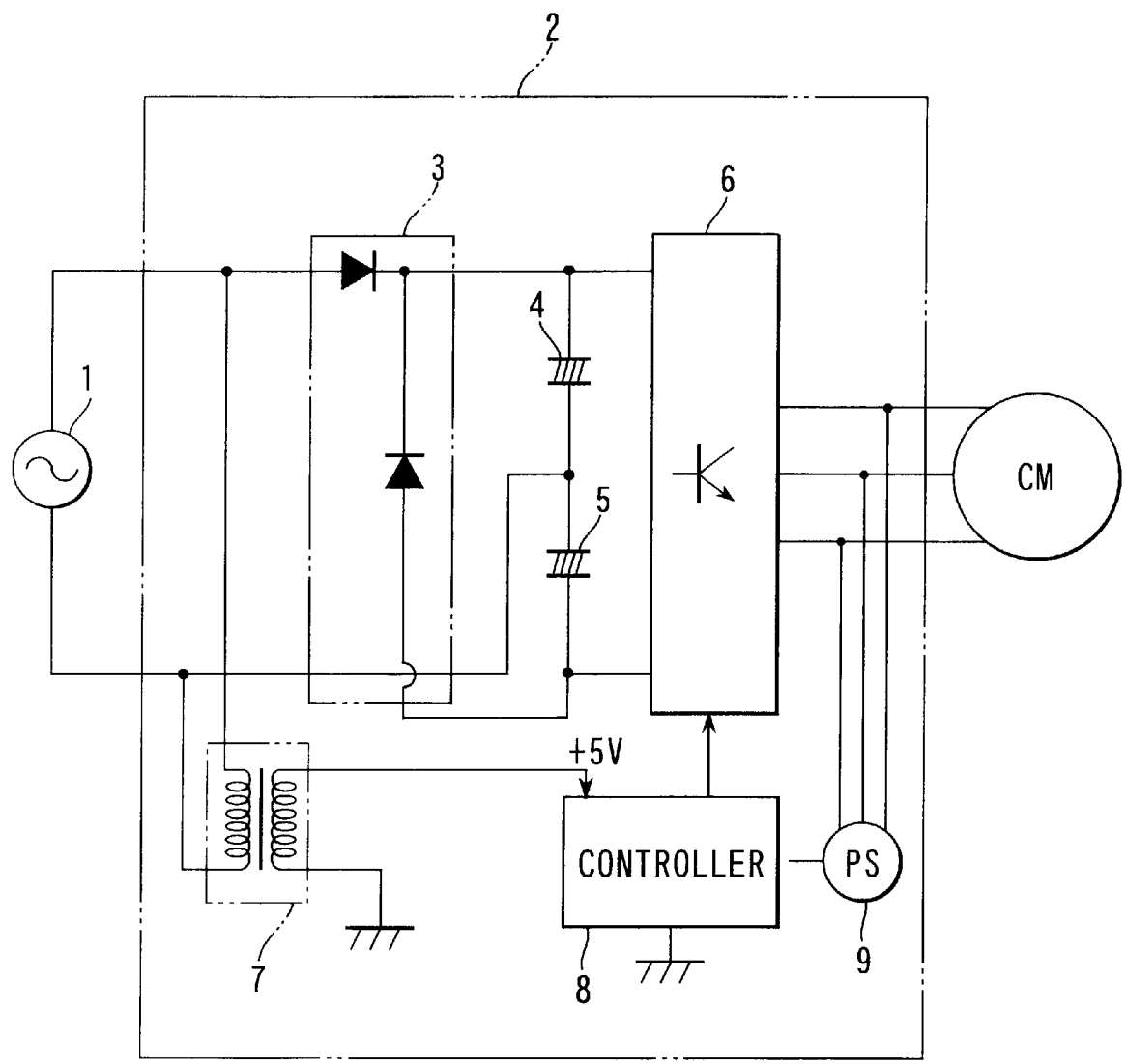
FIG. 1 is a block diagram of an electric circuit of a first embodiment of the present invention.

As shown in FIG. 1, an inverter apparatus 2 is connected to a commercial AC power source 1. An output terminal of the inverter circuit 2 is connected to a compressor motor CM.

The inverter apparatus 2 comprises a rectifier circuit 3 for rectifying a voltage of the commercial AC power source 1; smoothing capacitors, for example, electrolytic capacitors 4 and 5, for smoothing an output voltage of the rectifier circuit 3; a switching circuit 6 for converting a DC voltage smoothed by the electrolytic capacitors 4 and 5 to a three-phase AC voltage by turning on and off a plurality of switching elements; a transformer 7 for stepping down the voltage of the commercial AC power source 1; a controller 8 operated by a voltage on the secondary side of the transformer 7; and a rotational position detecting sensor 9 for detecting a rotational position of a rotor of the motor CM.

The controller 8 turns on and off the switching elements of the switching circuit 6 in the order corresponding to a detection result of the rotational position detecting sensor 9. This drive control causes the switching circuit 6 to output a three-phase AC voltage of a predetermined frequency. The motor CM is operated by this output.

Figure 2:
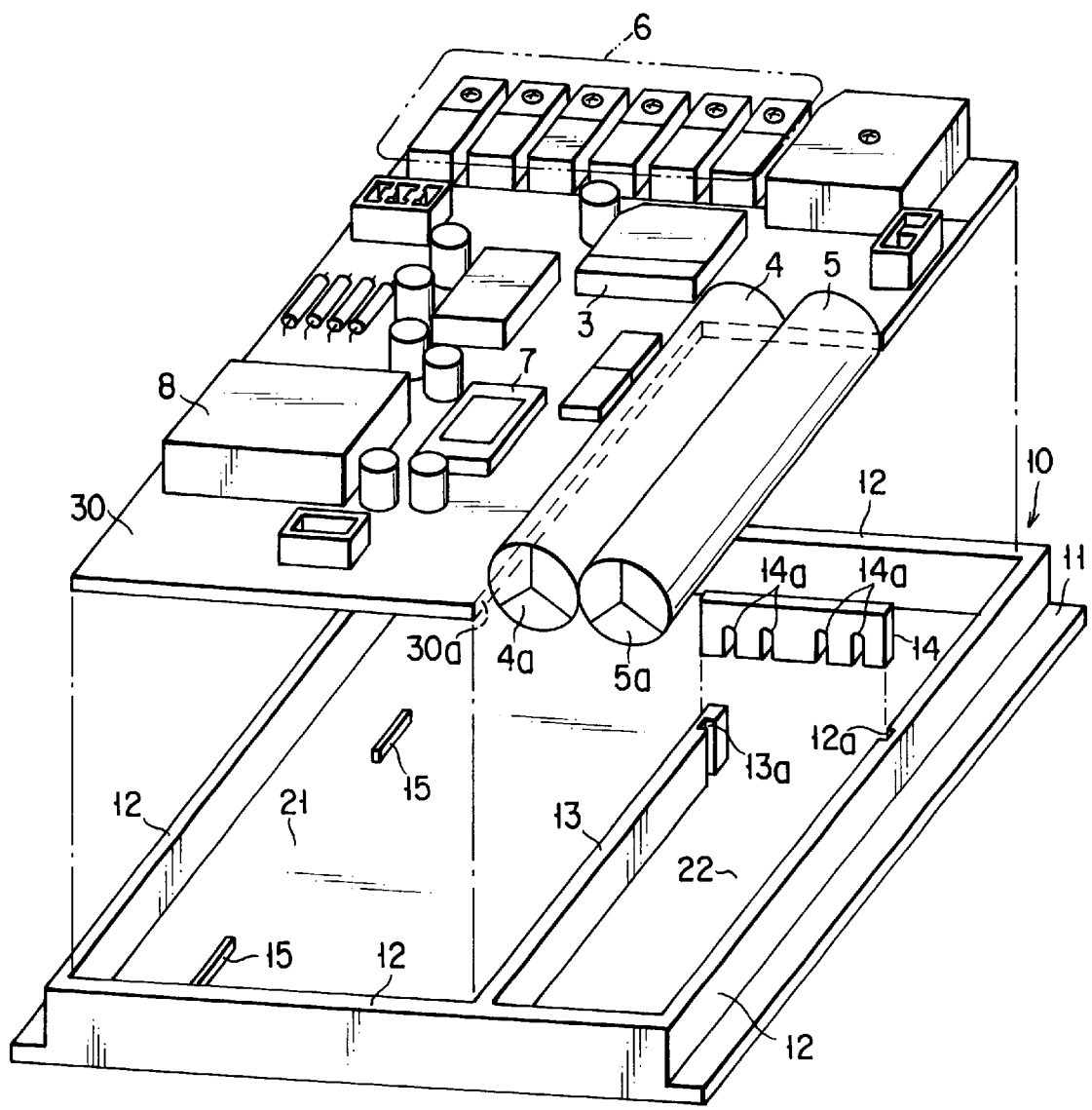
FIG. 2 is an exploded perspective view of the first embodiment.
Figure 3:
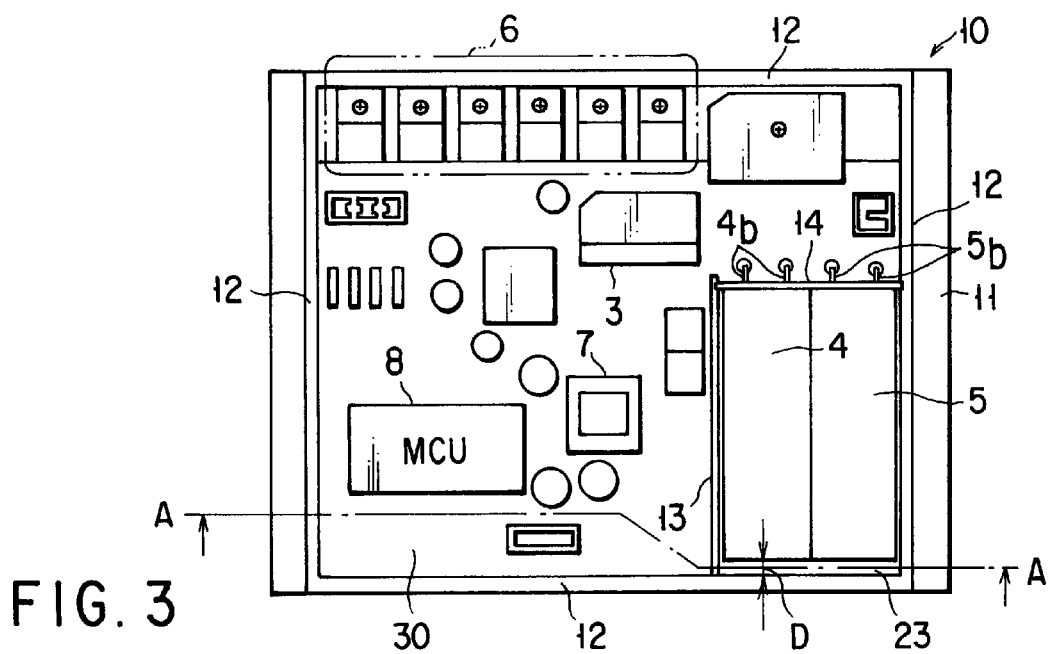
FIG. 3 is a top view showing the structure of the first embodiment.
Figure 4:
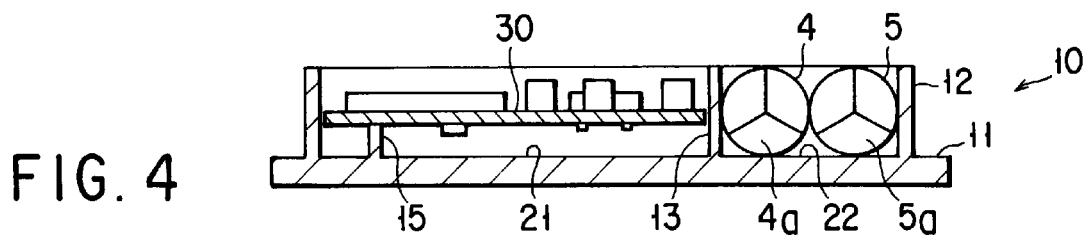
FIG. 4 is a cross-sectional view taken along the line A—A in FIG. 3 as viewed from the direction of the arrow.

FIGS. 2 to 4 show a detailed structure of the inverter apparatus 2. FIG. 2 is an exploded perspective view, FIG. 3 is a top view, and FIG. 4 is a cross-sectional view taken along the line A—A in FIG. 3 as viewed from the direction of the arrow.

The rectifier circuit 3, the switching circuit 6, the transformer 7 and the controller 8 are mounted on a board 30 having a rectangular cutout portion 30a. An electrically conductive pattern for connecting the aforementioned electric components on the board 30 is printed on the lower surface of the board 30. The cutout portion 30a has a size substantially corresponding to the area occupied by the electrolytic capacitors 4 and 5 in the state where they are laid sideways.

The board 30 is contained in a case 10 along with the electrolytic capacitors 4 and 5.

The electrolytic capacitors 4 and 5 are cylindrical, and have, at first ends thereof, gas-draining portions 4a and 5a for discharging gas when the internal gas pressure is increased by a rise in ambient temperature, or the like. The gas-draining portions 4a and 5a are made of film members for closing the first ends of the electrolytic capacitors 4 and 5, each film member having a plurality of cuts extending from a central portion a the periphery. When the internal gas pressures of the electrolytic capacitor 4 and 5 are increased, the film members are elastically deformed to open. Due to this opening, the high pressure gas in the electrolytic capacitor 4 or 5 is discharged out.

Lead wires 4b are drawn from the other end (bottom portion) of the electrolytic capacitor 4 and lead wires 5b are drawn from the other end (bottom portion) of the electrolytic capacitor 5.

The case 10 comprises a rectangular bottom plate 11; a frame-shaped side wall 12 formed on the periphery of the bottom plate 11; partition plates 13 and 14, formed on the bottom plate 11, for partitioning the upper surface of the bottom plate 11 into a first region 21 and a second region 22; and board supporting members 15 formed in the first region 21. An end of the partition plate 14 is fitted in a groove 13a of the partition plate 13, and the other end thereof is fitted in a groove 12a of the side wall 12, so that the partition plate 14 is retained.

The first region 21, for storing the board 30, has substantially the same shape as that of the board 30. When the board 30 is contained in the first region 21, it is supported by the board supporting members 15. By this support, a gap between the board 30 and the bottom plate 11 of the case 10 is maintained.

The second region 22, for containing the electrolytic capacitors 4 and 5 laid sideways, has substantially the same shape as that of the cutout portion 30a of the board 30. After the electrolytic capacitors 4 and 5 are contained in the second region 22, the partition plate 14 is attached. A lower portion of the partition plate 14 has grooves 14a to allow passage of the lead wires 4b of the electrolytic capacitor 4 and the lead wires 5b of the electrolytic capacitor 5.

The lead wires 4b and 5b are guided to the first region 21 through the grooves 14a of the partition plate 14, bent at substantially right angles in the first region 21 and connected to the electrically conductive pattern of the board 30.

In the state where the electrolytic capacitors 4 and 5 are contained in the second region 22, a space 23 is provided in a position corresponding to the gas-draining portions 4a and 5a of the electrolytic capacitors 4 and 5 (between the gas-draining portions 4a and 5a and the inner surface of the side wall 12). The space 23 has a depth D necessary for the film members constituting the gas-draining portions 4a and 5a to be elastically deformed and opened.

Figure 5:
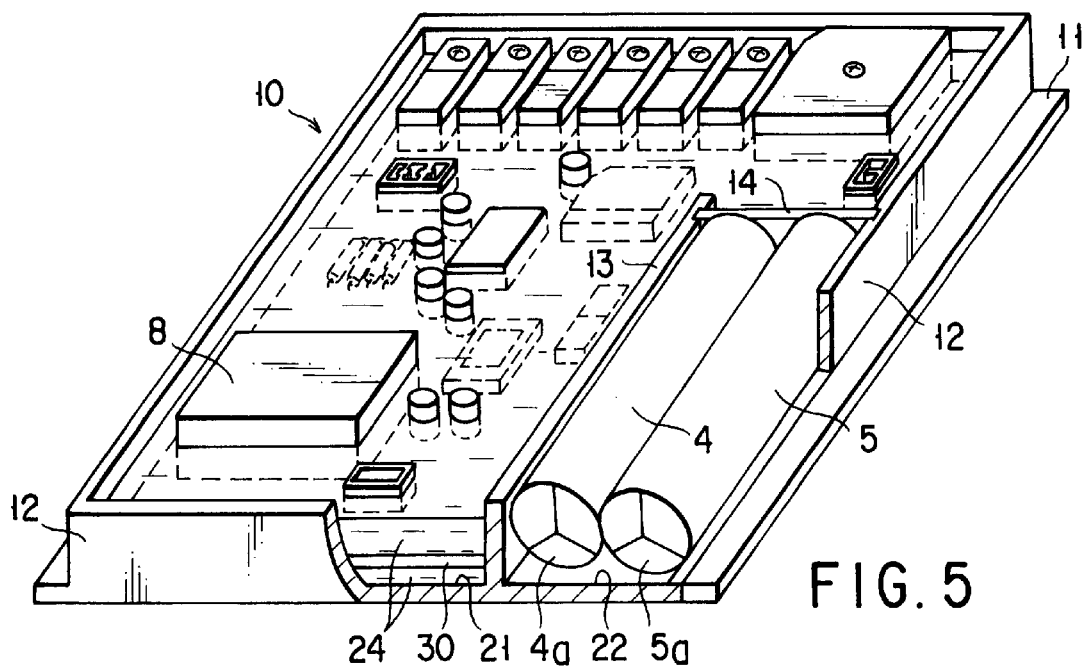
FIG. 5 is a perspective view showing a state in which the case of the first embodiment is filled with resin.

As shown in FIG. 5, resin, for example, urethane resin 24, is filled in the gap between the lower surface of the board 30 and the bottom plate 11 of the case 10 and above the board 30 to a certain thickness, for example, 1.6 mm or more. Some of the electric parts on the board 30 are buried in the urethane resin 24.

Since the urethane resin 24 is filled as described above, the electric parts mounted on the board 30 can be protected from moisture and dust. In addition, the board 30 can be electrically insulated. Moreover, it is ensured that the board 30 is fixed to the case 10.

Figure 6:
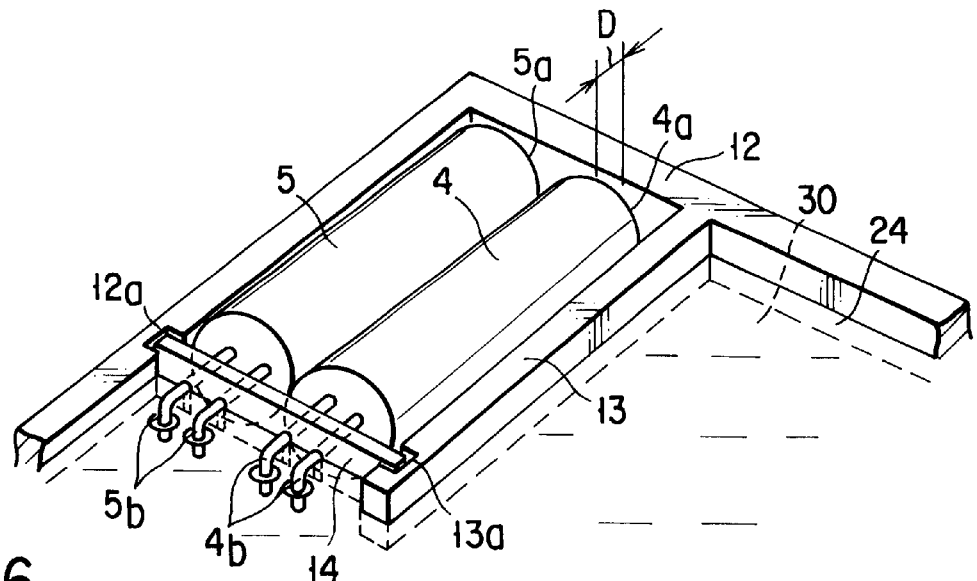
FIG. 6 is a perspective view showing a state in which the electrolytic capacitor is contained in the case of the first embodiment.

The lead wires 4b and 5b of the electrolytic capacitors 4 and 5 contained in the second region 22 are inserted in the first region 21 through the grooves 14a of the partition plate 14, and buried in the urethane resin 24, as shown in FIG. 6. Since the lead wires 4b and 5b are retained in this way on the side of the first region 21, the space 23 with the constant depth D is always maintained between the gas-draining portions 4a and 5a and the inner surface of the side wall 12. Owing to the existence of the space 23 with the constant depth D, the gas-draining portions 4a and 5a of the electrolytic capacitors 4 and 5 can be opened to discharge the high-pressure gas at any time without fail.

In particular, since the electrolytic capacitors 4 and 5 are laid sideways in the case 10, the height of the electric component box for storing the case 10 can be reduced. Consequently, the apparatus as a whole can be downsized.

[2] A second embodiment will be described.

Figure 7:
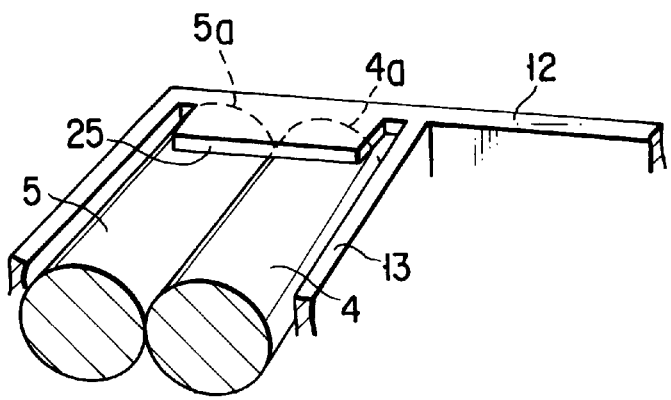
FIG. 7 is a perspective view showing the structure of a main part of a second embodiment of the present invention.

As shown in FIG. 7, a positioning member 25 is formed integral with the upper end of a portion of the side wall 12, to which the gas-draining portions 4a and 5a of the electrolytic capacitors 4 and 5 are opposed.

The positioning member 25 contacts with the circumferential surfaces of the electrolytic capacitors 4 and 5, thereby restricting flotation and positional deviation of the electrolytic capacitors 4 and 5. This restriction further ensures that the space 23 with the constant depth D is maintained.

The other structures and functions are the same as those of the first embodiment.

The positioning member 25 may be formed independent of the side wall 12, and attached to the side wall 12 when required.

[3] Third Embodiment

Figure 8:
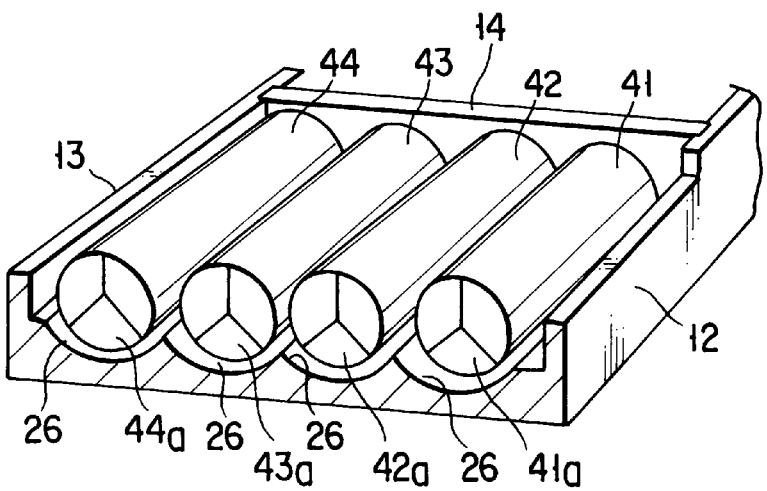
FIG. 8 is a perspective view showing the structure of a main part of a third embodiment of the present invention.

As shown in FIG. 8, four electrolytic capacitors 41, 42, 43 and 44 are used in place of the electrolytic capacitors 4 and 5. In this embodiment, recesses 26 for respectively positioning the electrolytic capacitors are formed side by side in the second region 22. The recesses 26 have curved surfaces having curvatures the same as those of the circumferential surfaces of the electrolytic capacitors. The recesses 26 restrict movement of the electrolytic capacitors in radial directions.

The other structures and functions are the same as those of the first embodiment.

[4] Fourth Embodiment

Figure 9:
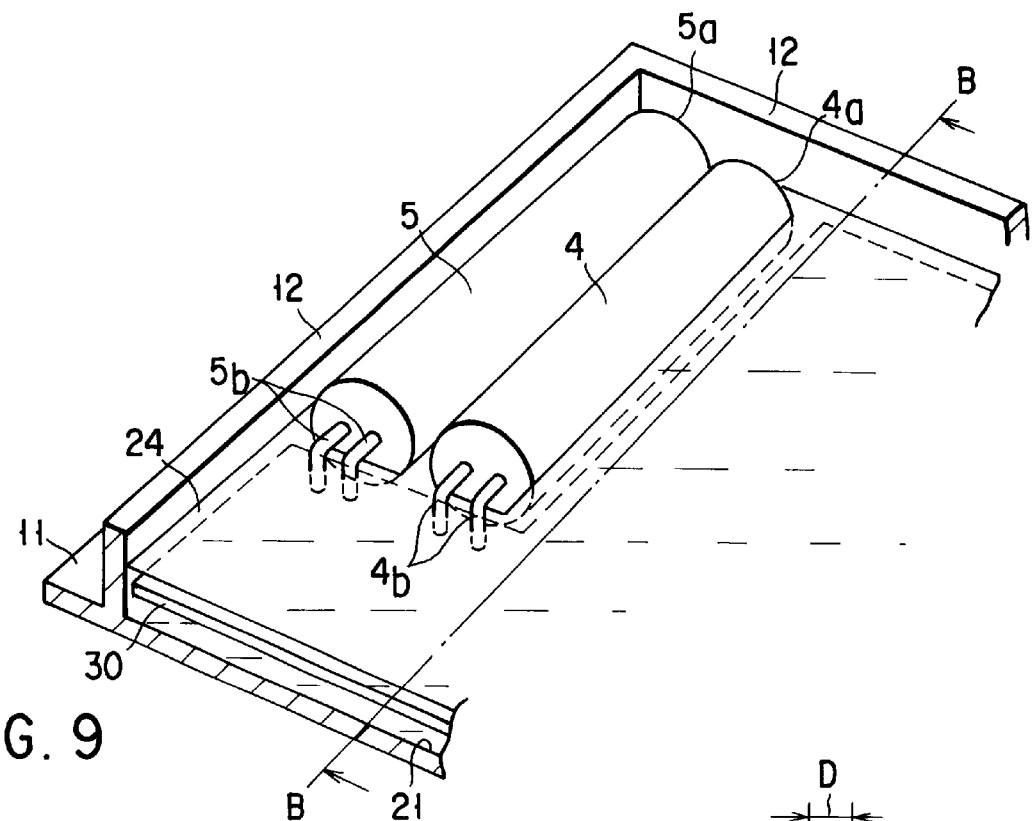
FIG. 9 is a perspective view showing the structure of a main part of a fourth embodiment of the present invention.

As shown in FIG. 9, the partition plates 13 and 14 are removed and the urethane resin 24 is filled also in the second region 22. The purpose of this structure is to fix the electrolytic capacitors 4 and 5 to the case 10.

In this case, the amount of the urethane resin 24 filled around the electrolytic capacitors 4 and 5 is restricted to ensure that the gas-draining portions 4a and 5a of the electrolytic capacitors 4 and 5 are openable.

Figure 10:
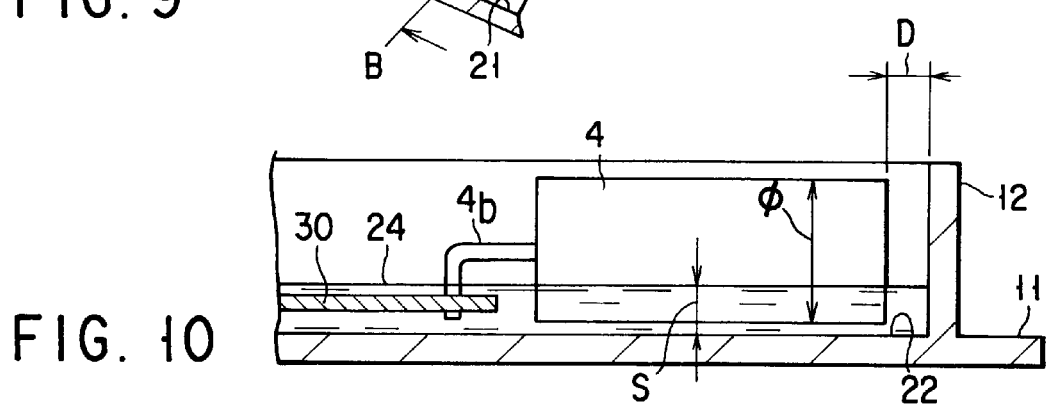
FIG. 10 is a cross-sectional view taken along the line B—B in FIG. 9 as viewed from the direction of the arrow.

More specifically, as shown in FIG. 10, the thickness of the urethane resin 24 on the bottom plate 11 of the case 10 is set to a predetermined value ranging from 1.6 mm to about one thirds the diameter φ of the electrolytic capacitors 4 and 5.

The other structures and functions are the same as those of the first embodiment.

[5] Fifth Embodiment

Figure 11:
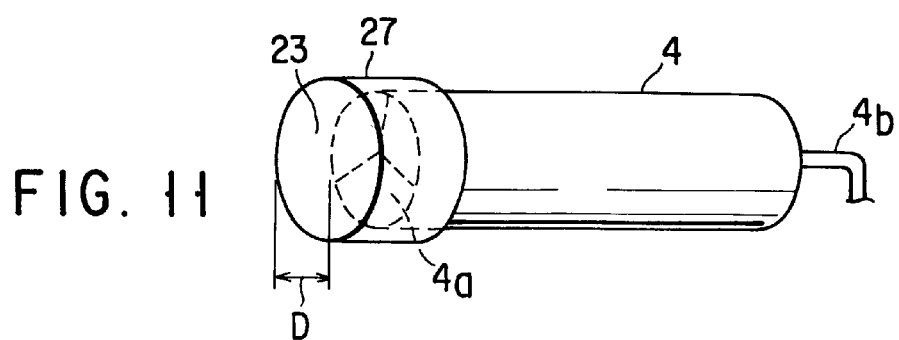
FIG. 11 is a perspective view showing the structure of a main part of a fifth embodiment of the present invention.

As shown in FIG. 11, a cap 27 is fit to an end (the gas-draining portion 4a) of the electrolytic capacitor 4. As a result, a space 23 having a constant depth D is maintained between the gas-draining portion 4a and the inner bottom of the cap 27. The same cap 27 is fit also to an end (the gas-draining portion 5a) of the electrolytic capacitor 5. As a result, a space 23 having the constant depth D is maintained between the gas-draining portion 5a and the inner bottom of the cap 27.

The electrolytic capacitors 4 and 5 with the caps 27 as described above are contained in the second region 22.

The partition plates 13 and 14 are not provided. Not only the first region 21 but also the second region 22 of the case 10 are filled with the urethane resin 24. The purpose of the urethane resin 24 filled in the second region 22 is to fix the electrolytic capacitors 4 and 5 to the case 10.

Even when the second region 22 is filled with the urethane resin 24, the urethane resin 24 does not enter the caps 27. The spaces 23 having the constant depth D necessary for the gas-draining portions 4a and 5a to open are maintained inside the respective caps 27.

The other structures and functions are the same as those of the first embodiment.

[6] Sixth Embodiment

Figure 12:
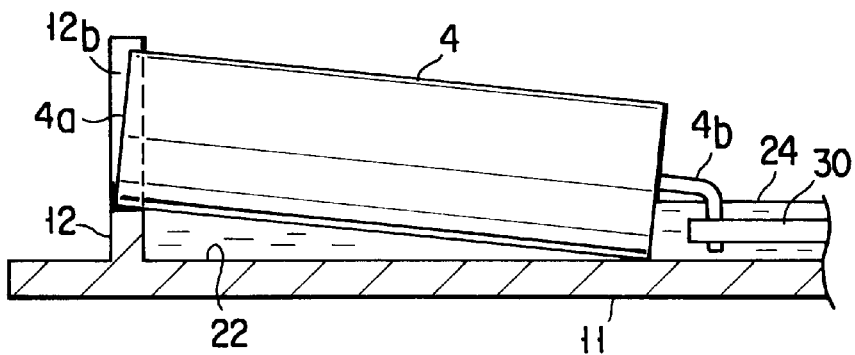
FIG. 12 is a perspective view showing the structure of a main part of a sixth embodiment of the present invention.

As shown in FIG. 12, recesses 12b are formed in the side wall 12 of the case 10. The first ends (the gas-draining portions 4a and 5a) of the electrolytic capacitors 4 and 5 are respectively put in the recesses 12b.

The partition plates 13 and 14 are not provided. Not only the first region 21 but also the second region 22 of the case 10 are filled with the urethane resin 24. The purpose of the urethane resin 24 filled in the second region 22 is to fix the electrolytic capacitors 4 and 5 to the case 10.

Even when the second region 22 is filled with the urethane resin 24, the urethane resin 24 does not close the gas-draining portions 4a and 5a of the electrolytic capacitors 4 and 5, since the first ends (the gas-draining portions 4a and 5a) of the electrolytic capacitors 4 and 5 are put on the recesses 12b and exposed to the outside of the case. Since neither the urethane resin 24 nor the side wall 12 is present in front of the gas-draining portions 4a and 5a of the electrolytic capacitors 4 and 5, sufficient space to allow the gas-draining portions 4a and 5a to open is ensured.

The other structures and functions are the same as those of the first embodiment.

[7] Seventh Embodiment

Figure 13:
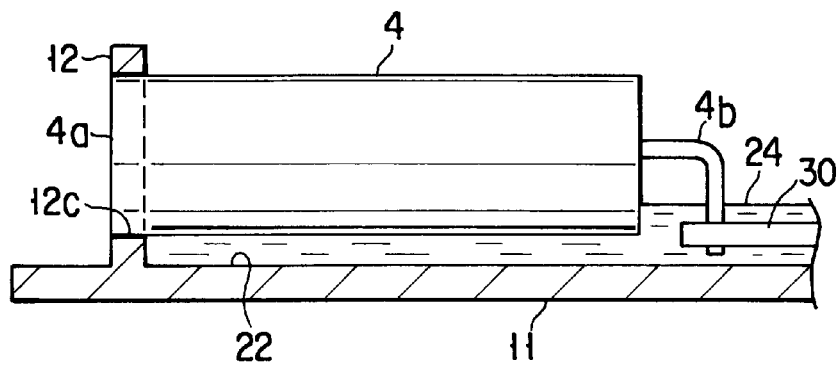
FIG. 13 is a perspective view showing the structure of a main part of a seventh embodiment of the present invention.

As shown in FIG. 13, openings 12c are formed in the side wall 12 of the case 10. The first ends (the gas-draining portions 4a and 5a) of the electrolytic capacitors 4 and 5 are respectively fitted to the opening 12c.

The partition plates 13 and 14 are not provided. Not only the first region 21 of the case 10 but also the second region 22 are filled with the urethane resin 24. The purpose of the urethane resin 24 filled in the second region 22 is to fix the electrolytic capacitors 4 and 5 to the case 10.

Even when the second region 22 is filled with the urethane resin 24, the urethane resin 24 does not close the gas-draining portions 4a and 5a of the electrolytic capacitors 4 and 5, since the first ends (the gas-draining portions 4a and 5a) of the electrolytic capacitors 4 and 5 are fitted to the opening 12c and exposed to the outside of the case. Since neither the urethane resin 24 nor the side wall 12 is present in front of the gas-draining portions 4a and 5a of the electrolytic capacitors 4 and 5, sufficient space to allow the gas-draining portions 4a and 5a to open is ensured.

The other structures and functions are the same as those of the first embodiment.

[8] Eighth Embodiment

Figure 14:
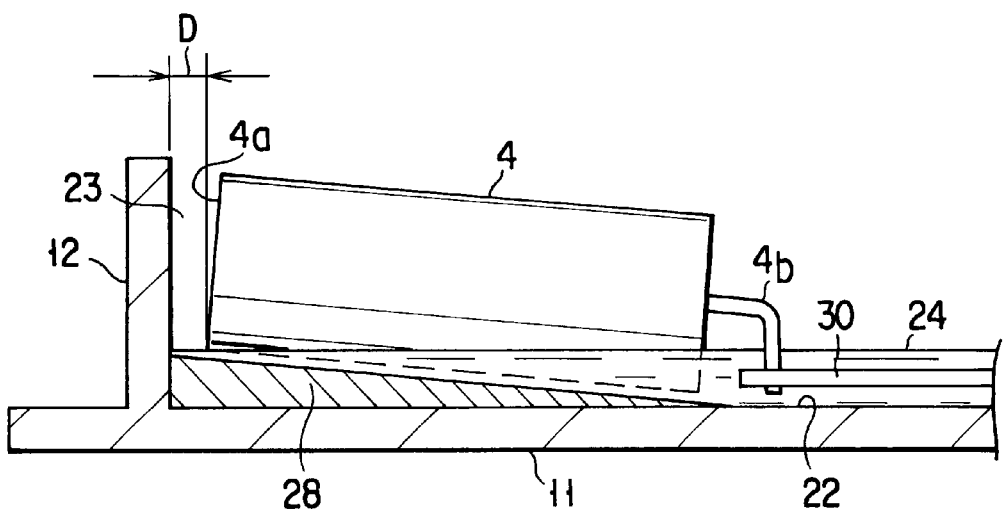
FIG. 14 is a perspective view showing the structure of a main part of an eighth embodiment of the present invention.

As shown in FIG. 14, an inclined member 28 which is gradually higher toward the side wall 12 is provided in the second region 22. The electrolytic capacitors 4 and 5 are mounted on the inclined member 28 such that a space 23 having a constant depth D is maintained between the side wall 12 and the electrolytic capacitors 4 and 5.

The partition plates 13 and 14 are not provided. Not only the first region 21 of the case 10 but also the second region 22 are filled with the urethane resin 24. The purpose of the urethane resin 24 filled in the second region 22 is to fix the electrolytic capacitors 4 and 5 to the case 10.

Even when the second region 22 is filled with the urethane resin 24, the urethane resin 24 does not close the gas-draining portions 4a and 5a of the electrolytic capacitors 4 and 5, since the first ends (the gas-draining portions 4a and 5a) of the electrolytic capacitors 4 and 5 are located on the highest portion of the inclined member 28. Therefore, sufficient space to allow the gas-draining portions 4a and 5a to open is ensured in front of the gas-draining portions 4a and 5a of the electrolytic capacitors 4 and 5.

The other structures and functions are the same as those of the first embodiment.

[9] Ninth Embodiment

Figure 15:
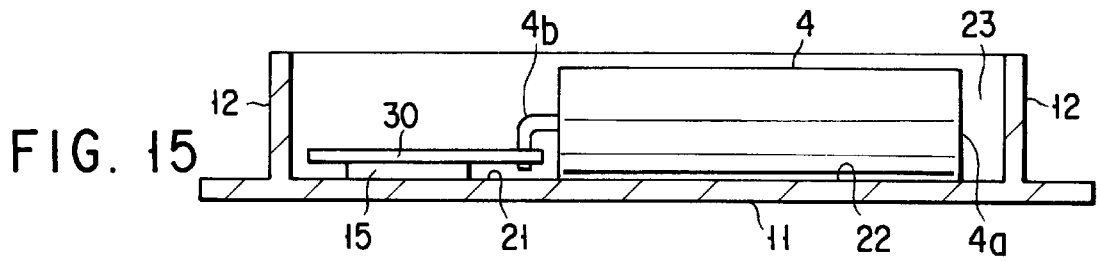
FIGS. 15 to 18 are cross-sectional views showing the structure of a main part of a ninth embodiment of the present invention.

As a first step, the electrolytic capacitors 4 and 5 are contained in the second region 22, as shown in FIG. 15. In this case, a space 23 with the constant depth D is ensured between the first ends of the electrolytic capacitors 4 and 5 (the gas-draining portions 4a and 5a) and the inner surface of the side wall 12.

Figure 16:
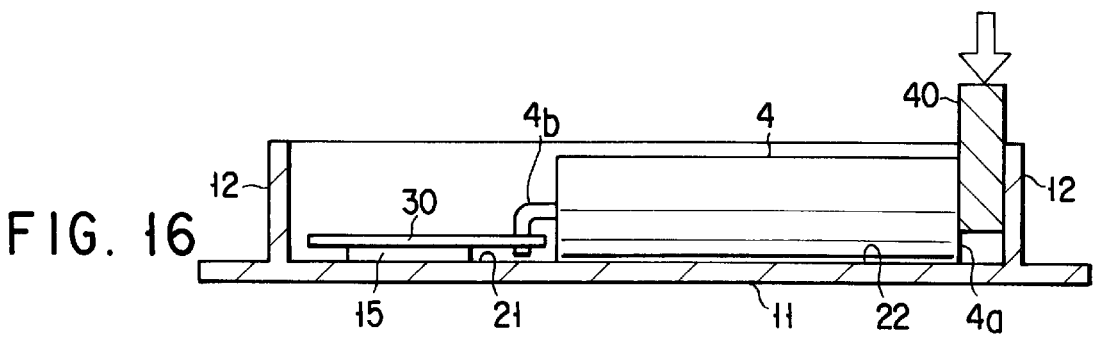
Figure 17:
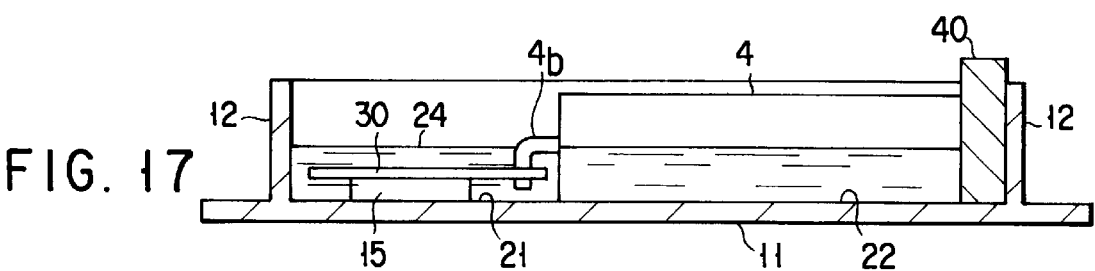

As a second step, a jig 40 is inserted in the space 23, as shown in FIG. 16. In this case, the jig 40 is fully pressed until the lower end of the jig 40 is completely brought into contact with the bottom plate 11 of the case 10. The width of the jig 40 is equal to the depth D of the space 23.

As a third step, as shown in FIG. 16, the urethane resin 24 is filled in the first and second regions 21 and 22 of the case in the state where the jig 40 is fitted in the space 23. The purpose of the urethane resin 24 filled in the second region 22 is to fix the electrolytic capacitors 4 and 5 to the case 10.

Figure 18:
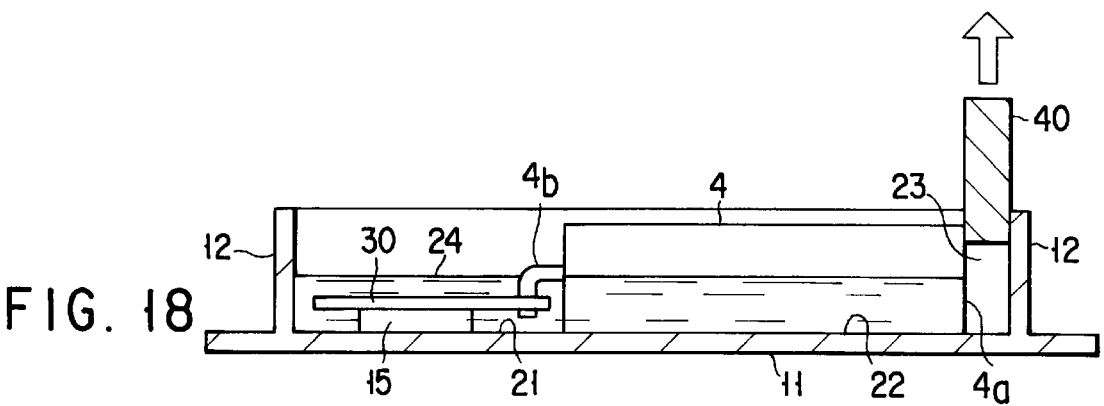

As a fourth step, as shown in FIG. 18, the jig 40 is extracted, after the filled urethane resin 24 is completely cured.

After the jig 40 is extracted, space 23 containing no urethane resin 24 is provided. In other words, sufficient space to allow the gas-draining portions 4a and 5a to open is ensured in front of the gas-draining portions 4a and 5a of the electrolytic capacitors 4 and 5.

The other structures and functions are the same as those of the first embodiment.

[10] In the above embodiments, two or four electrolytic capacitors are used as smoothing capacitors. However, the number of electrolytic capacitors is not limited. Further, the resin filled in the case is not limited to urethane resin, but another kind of resin can be used.

The present invention is not limited to the above embodiments, but can be modified variously without changing the gist of the invention.

Industrial Applicability

The present invention is applicable to not only driving a compressor motor but the motor of another kind of apparatus.

What is claimed is:

1. An inverter apparatus comprising:
   a rectifier circuit for rectifying an AC voltage;
   at least one cylindrical capacitor for smoothing a voltage output from the rectifier circuit, the capacitor having at a first end a gas-draining portion which is opened when an internal gas pressure is increased;
   a switching circuit for converting the voltage smoothed by the capacitor to an AC voltage;
   a board on which the rectifier circuit and the switching circuit are mounted, the board having a notch at a corner;
   a case having a first region for containing the board and a second region for containing the capacitor laid sideways through the use of the notch of the board, and ensuring a space necessary for the gas-draining portion of the capacitor contained in the second region to open, at a position corresponding to the gas-draining portion;
   a lead wire drawn from the other end of the capacitor and guided to the first region in a state where the capacitor is contained in the second region of the case, the lead wire being bent at substantially right angles in the first region and connected to the board; and
   resin used in the first region of the case and on the board contained in the first region.

2. An apparatus according to claim 1, wherein the case has a rectangular bottom plate; a side wall surrounding a peripheral portion of the bottom plate; and partitioning plates, mounted on the bottom plate, for partitioning an upper surface of the bottom plate into the first region and the second region.

3. An apparatus according to claim 1, further comprising a positioning member for restricting flotation and positional deviation of the capacitor contained in the second region of the case.

4. An apparatus according to claim 1, further comprising resin filled in the second region of the case in a state where the capacitor is contained in the second region.

5. An apparatus according to claim 1, further comprising:
   a cap fitted to the first end of the capacitor, having a space therein necessary for the gas-draining portion of the capacitor to open; and
   resin filled in the second region of the case in a state where the capacitor is contained in the second region.

6. An apparatus according to claim 1, wherein the case allows the first end of the capacitor to be exposed outside the case in order to ensure the space necessary for the gas-draining portion of the capacitor contained in the second region to open.

7. An apparatus according to claim 1, further comprising:
   an inclined member, provided in the second region, for setting the first end of the capacitor contained in the second region higher than a second end thereof; and
   resin filled in the second region of the case in a state where the capacitor is contained in the second region.

8. A method for manufacturing an inverter apparatus comprising:
   a rectifier circuit for rectifying an AC voltage;
   at least one cylindrical capacitor for smoothing a voltage output from the rectifier circuit, the capacitor having at a first end a gas-draining portion which is opened when an internal gas pressure is increased;
   a switching circuit for converting the voltage smoothed by the capacitor to an AC voltage;
   a board on which the rectifier circuit and the switching circuit are mounted, the board having a notch at a corner;
   a case having a first region for containing the board and a second region for containing the capacitor laid sideways through the use of the notch of the board, and ensuring a space necessary for the gas-draining portion of the capacitor contained in the second region to open, at a position corresponding to the gas-draining portion;
   a lead wire drawn from the other end of the capacitor and guided to the first region in a state where the capacitor is contained in the second region of the case, the lead wire being bent at substantially right angles in the first region and connected to the board; and
   resin used in the first region of the case and on the board contained in the first region,
   said method comprising:
      a first step of containing the capacitor in the case;
      a second step of inserting a jig in the space provided in the case;
      a third step of filling the case with resin in a state where the jig is inserted; and
      a fourth step of extracting the jig after the filled-resin is cured.

* * * * *